(12) United States Patent
Johnson et al.

(10) Patent No.: US 6,455,908 B1
(45) Date of Patent: Sep. 24, 2002

(54) MULTISPECTRAL RADIATION DETECTORS USING STRAIN-COMPENSATING SUPERLATTICES

(75) Inventors: Jeffery L. Johnson, Sugar Land, TX (US); Chih-Hsiang Lin, Sugar Land, TX (US)

(73) Assignee: Applied Optoelectronics, Inc., Sugar Land, TX (US)

(*) Notice: Subject to any disclaimer, the term of this patent is extended or adjusted under 35 U.S.C. 154(b) by 28 days.

(21) Appl. No.: 09/802,368

(22) Filed: Mar. 9, 2001

(51) Int. Cl.[7] ............................................. H01L 31/00
(52) U.S. Cl. ........................ 257/440; 257/184; 257/190
(58) Field of Search .......................................... 257/190

(56) References Cited

U.S. PATENT DOCUMENTS

| | | |
|---|---|---|
| 5,113,076 A | 5/1992 | Schulte |
| 5,479,032 A | 12/1995 | Forrest et al. |
| 5,731,621 A * | 3/1998 | Kosai ........................ 257/440 |

OTHER PUBLICATIONS

Johnson, J. L. et al., "Electrical and Optical Properties of Infrared Photodiodes Using the $InAs/Ga_{1-x}In_xSb$ Superlattice in Heterojunctions with GaSb," *J. Appl. Phys.* 80(2), (1996), pp. 1116–1127.

Bürkle, L. et al., "Electrical Characterization of InAs/(GaIn)Sb Infrared Superlattice Photodiodes for the 8 to 12 μm Range," *Material Research Society Symposium Proceedings*, vol. 607, (2000), p. 77.

Fuchs, F. et al., "$InAs/Ga_{1-x}In_xSb$ Infrared Superlattice Photodiodes for Infrared Detection," *Proc. SPIE*, vol. 3287, (1998) p. 14.

Willardson, R.K. and Beer, Albert C., eds. (New York: Academic Press, 1990), *Semiconductors and Semimetals*, vol. 32, Strained Layer Superlattices: Physics, Chapter 1, pp. 1–15.

Fuchs, F. et al., "Optoelectronic Properties of Photodiodes for the Mid– and Far–Infrared Based on the InAs/GaSb/AlSb Materials Family," Presented at *Photonics West 2001 SPIE Conference*, San Jose, CA (Jan. 2001) pp. 1–12.

de Lyon, T. et al., "Molecular Beam Epitaxial Growth of HgCdTe Midwave Infrared Multispectral Detectors," *J. Vac. Sci. Technol. B.* 16(3), 1998, pp. 1321–1325.

* cited by examiner

*Primary Examiner*—Olik Chaudhuri
*Assistant Examiner*—Douglas A. Wille
(74) *Attorney, Agent, or Firm*—N. Stephen Kinsella (57) ABSTRACT

A multispectral radiation detector for detecting radiation in at least two spectral bands, comprises a substrate and a layer stack grown on the substrate. The layer stack comprises at least first and second photodiodes, each photodiode having at least one strain-compensating superlattice absorbing layer substantially lattice matched to adjacent layers of the detector. Each strain-compensating superlattice absorbing layer has an energy gap responsive to radiation energy in a corresponding spectral region and different from the energy gaps of other strain-compensating superlattice absorbing layers of the detector.

16 Claims, 3 Drawing Sheets

MULTISPECTRAL RADIATION DETECTORS USING STRAIN-COMPENSATING SUPERLATTICES

BACKGROUND OF THE INVENTION

1. Field of the Invention

This invention pertains to detection of radiation, and more particularly to multispectral radiation detectors for detection of radiation in multiple spectral bands.

2. Description of the Related Art

The following descriptions and examples are not admitted to be prior art by virtue of their inclusion within this section.

It is desirable to employ radiation detectors to convert electromagnetic radiation, such as infrared (IR) radiation, into electrical signals. The term photodetector is sometimes used, and is used herein, to refer to any type of radiation detector, i.e. a detector that detects electromagnetic radiation. Such detectors may be used in a variety of applications, including thermal imaging and transmission of information using signals having infrared wavelengths. One type of photodetector is the junction photodetector, or photodiode, which has a semiconductor p-n junction that produces electrical current under illumination with electromagnetic radiation. Other approaches, such as the use of bolometers which detect temperature changes caused by incident radiation, or quantum-well intra-subband detectors in which incident radiation causes excitation of electrons between confined energy states of a quantum well, generally provide lower sensitivity and/or slower frequency response.

Figure 1A:
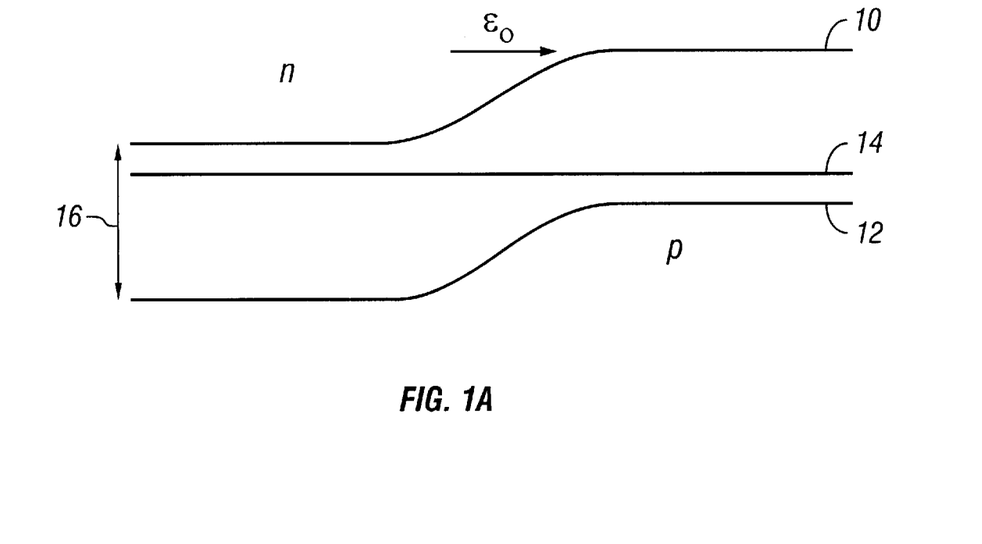
FIG. 1 includes exemplary energy band diagrams of a p-n junction photodetector.
Figure 1B:
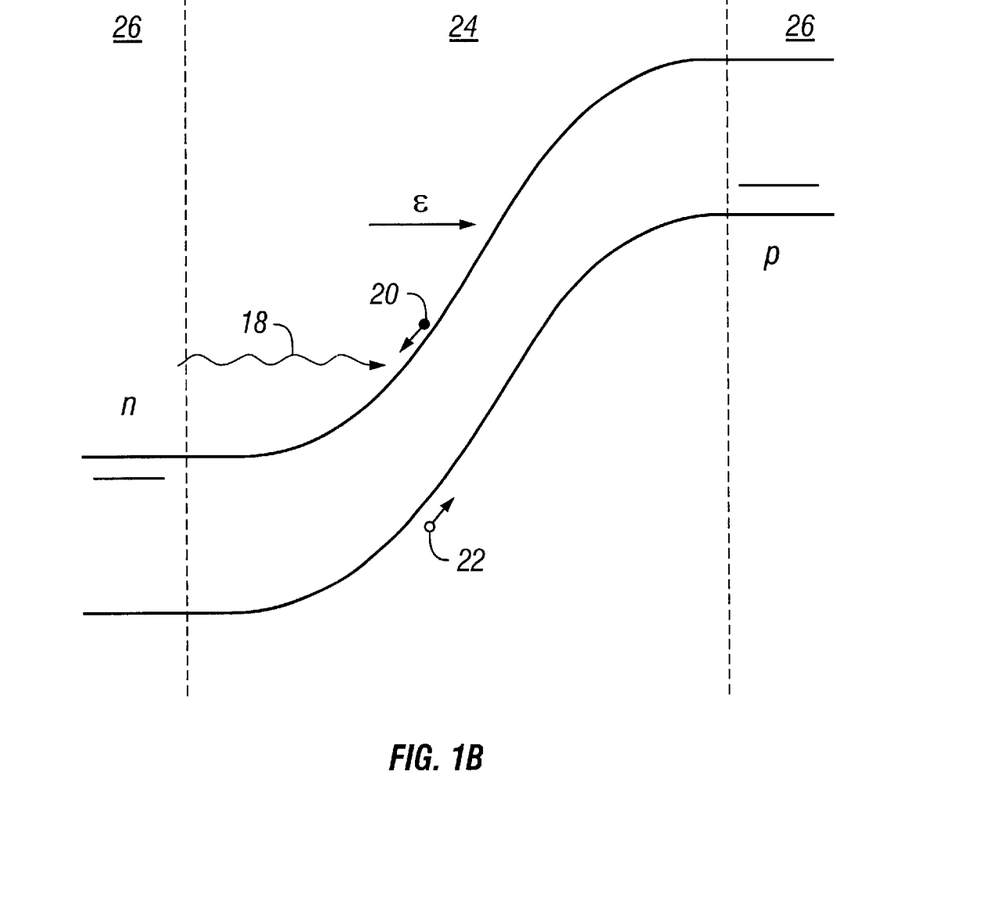

The operation of a basic semiconductor p-n junction photodetector is illustrated by the energy band diagrams of FIGS. 1A–B. An energy band diagram, showing electron energy vs. distance, of a p-n junction under equilibrium conditions is shown in FIG. 1A. This diagram includes conduction band edge 10, valence band edge 12, and Fermi energy level 14. The energy difference 16 between the conduction and valence band energies is known as the energy gap, or bandgap, of the semiconductor. Because the same semiconductor material is used throughout the junction of FIG. 1A, this energy gap is shown as constant with distance throughout the junction.

Conduction in a semiconductor can generally be described in terms of the movement of electrons in the conduction band (having energy at and above that of conduction band edge 10) and holes in the valence band (having energy at and below that of valence band edge 12). The proximity of Fermi level 14 to conduction band edge 10 on the left side of the junction indicates that this portion of the semiconductor is doped n-type, while the right side of the junction is doped p-type. On the n-type side of the junction the majority carriers are electrons and the minority carriers are holes, while the reverse is true on the p-type side. The p-n junction includes a built-in electric field $\epsilon_0$ in the junction region where the conduction and valence band edges are bent. The field exerts a force moving any holes appearing in this junction region to the right (in the direction of the field, as shown by the arrow in FIG. 1A), and moving any electrons appearing in the junction region to the left (opposite the direction of the field).

A photodiode is typically operated with the p-n junction reverse-biased, as shown in FIG. 1B. As in the case of built-in electric field of FIG. 1A, the larger applied electric field of FIG. 1B forces electrons toward the n-type side of the junction and holes toward the p-type side. Electrons and holes may be generated in the junction region by absorption of an incident photon such as photon 18. If photon 18 has energy higher than energy gap 16, absorption of the photon may provide energy to excite an electron from the valence band to the conduction band, creating conduction electron 20 and hole 22. The junction region 24 over which electric field $\epsilon$ appears may be considered the collection region of the photodiode (collecting the photogenerated carriers), while the outer neutral n-type and p-type regions may be considered absorber regions, as well as contact regions for connecting the photodiode to a surrounding circuit. Because electrons are collected on the n-type side and holes on the p-type side, each contact collects photogenerated majority carriers. The designation of a "majority" or "minority" carrier is dependent upon the location of the carrier within the device. A hole formed by absorption of a photon on the n-type side of the photodiode is a minority carrier when formed, and becomes a majority carrier upon being transported by the electric field to the p-type side of the photodiode.

When properly biased, the photodiode thus produces a current related in a known manner to the electromagnetic radiation incident thereon. Photodiodes are used, for example, to detect short-, mid-, and long-wavelength IR radiation having wavelengths from about 1 $\mu$m to about 30 $\mu$m.

Semiconductor-based IR photon detectors (photodiodes), as well as other types of radiation detectors, are generally characterized as having an energy gap (bandgap) that is suitable for absorbing radiation within a specified spectral region. Infrared detectors that gather data in more than one IR spectral band can determine increased information from the scene to further improve sensitivity above that of single-band detection. Because a new dimension of contrast is obtained, the detection of radiation within two or more spectral regimes using a single detector has been established as a desirable goal. A single detector capable of detecting radiation of two or more distinct spectral regions, or "colors," may be referred to as a multispectral, or multicolor, photodetector.

There are two primary ways to achieve multicolor capability: "multiple detector" systems having separate detectors for each spectral band; and "multispectral detectors" that provide separate but spatially and temporally collocated signals from multiple IR spectral bands using a single detector element. To obtain multiple spectral band sensitivity, multiple detector systems currently rely on cumbersome imaging techniques that either disperse the optical signal across multiple IR detectors or use a filter wheel to spectrally discriminate the image focused on single detecting element. In comparison, integrated multispectral detectors offer separate and simultaneous sensitivity to different spectral bands within the same detector unit cell (spatially collocated). The use of an integrated multispectral detector eliminates the need for aligning two or more detectors and also reduces the number of on-board optical components, thereby providing significant reduction of weight and power in a simpler, more reliable, and less costly package. Furthermore, the temporal and spatial co-registration between each spectral field occurs on the pixel level, which enables high-performance signal processing.

Figure 2A:
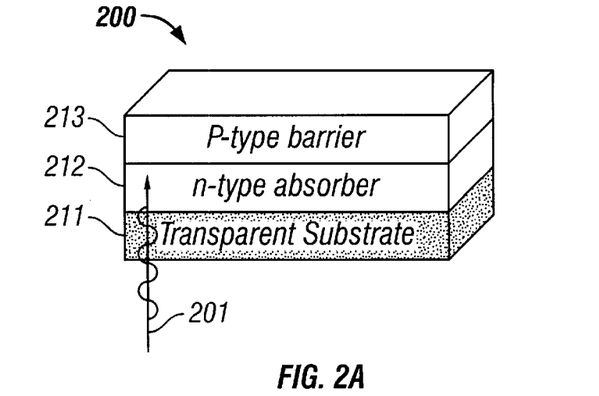
FIG. 2A is a perspective view of the wafer layer structure of an exemplary single-color photodetector.

Referring now to FIG. 2A, there is shown a perspective view of the wafer layer structure of an exemplary single-color photodetector 200. Such a photodiode detector is formed from a plurality of absorption layers stacked on a common substrate. To fabricate such a photodetector, an n-type absorption layer 212 is grown on a transparent substrate 211, followed by a p-type barrier layer 213 to form the IR photodiode. Light 201 within the spectral absorption band 212 of the n-type absorber layer which impinging upon the photodiode of detector 200 is transmitted through transparent substrate 211, and absorbed by n-type absorber region 212. When the photodiode of the junction of layers 213, 212 is properly biased, the absorption of the light causes a corresponding current to flow across the p-n junction of the photodiode. Photodetector 200 thus produces a current having a magnitude related in a known manner to the intensity of radiation within the spectral band of region 212 impinging on the photodiode of detector 200.

Figure 2B:
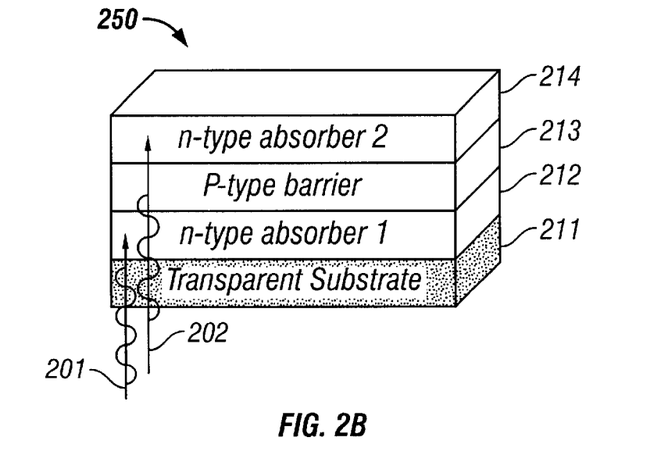
FIG. 2B is a perspective view of the wafer layer structure of an exemplary two-color photodetector, which may be operated in simultaneous mode.

Two-color detection is achieved by extending the structure of photodetector 200 by one additional absorbing layer tuned to respond to the IR radiation that transmits through the lower layers. Referring now to FIG. 2B, there is shown a perspective view of the wafer layer structure of an exemplary two-color photodetector 250, which is also formed from a plurality of absorption layers stacked on a common substrate, and as described in U.S. Pat. No. 5,113,076 (Schulte), the entirety of which is incorporated by reference herein. Two-color detectors such as photodetector 250 extend upon single-color design of FIG. 2A by simply growing a second n-type absorbing layer 214 on top of the p-type barrier layer 213 to form two back-to-back (tandem) photodiode junctions.

Vertically stacking two p-n junctions, as illustrated in FIG. 2B, permits incorporation of two tandem photodiodes or detectors (layers 214, 213; 212, 213) into a single detector element 250. Varying the composition of the absorbing materials of n-type absorption layers 212, 214 controls the spectral sensitivity and cutoff wavelength of each junction. The first layer 212 responds to a shorter wavelength IR radiation (i.e., light 201), allowing the longer wavelength radiation (i.e., light 202) to pass through the first absorber and barrier layer and to be absorbed in the longer wavelength-sensitive material of layer 214 on the top. An SLS absorption layer of a photodiode generally absorbs radiation up to a cutoff wavelength. It is in this sense a long-pass filter, passing (not absorbing) radiation above its cutoff wavelength. Radiation below its cutoff wavelength is absorbed, meaning the photons of the EM radiation are converted to electrons, which result in a current delta across the photodiode junction when the photodiode is properly biased. The amount of current resulting from a given intensity of in-band radiation depends on the absorption coefficient of the photodiode, as will be appreciated.

While material layer design dictates the spectral bands of the respective n-type absorption layers, the fabrication process determines the detection mode. Two-color detectors fabricated from multi-layer materials, such as detector 250, can operate in either sequential or simultaneous mode. In simultaneous mode, each detector (e.g., a unit cell of an array of detectors, where each cell represents a pixel) is independently accessed by making electrical contact not only to the top and bottom (common) n-type absorber layers, but also to the shared p-type barrier layer. For simultaneous detection, two top contacts per unit cell are required, in addition to the bottom (common) contact. Thus, a first metal contact (e.g. an indium bump) is deposited on n-type absorption layer 214. A portion of n-type absorption layer 214 is etched to permit the deposition of a second metal contact onto p-type barrier layer 213. The two photodiodes may thus be independently biased, and the current in each independently sensed, to simultaneously detect the intensity of radiation absorbed by each of layers 212, 214. The spectral bands to which layers 212, 214 are sensitive may be referred to as bands 1 and 2, respectively. Discussion of these types of detectors can be found in R. D. Rajavel, J. L. Johnson et al., "Molecular beam epitaxial growth and performance of HgCdTe-based simultaneous mode two-color detectors," *J. Electr. Mat.*, vol. 27, no. 6 (1998): 747.

Figure 3:
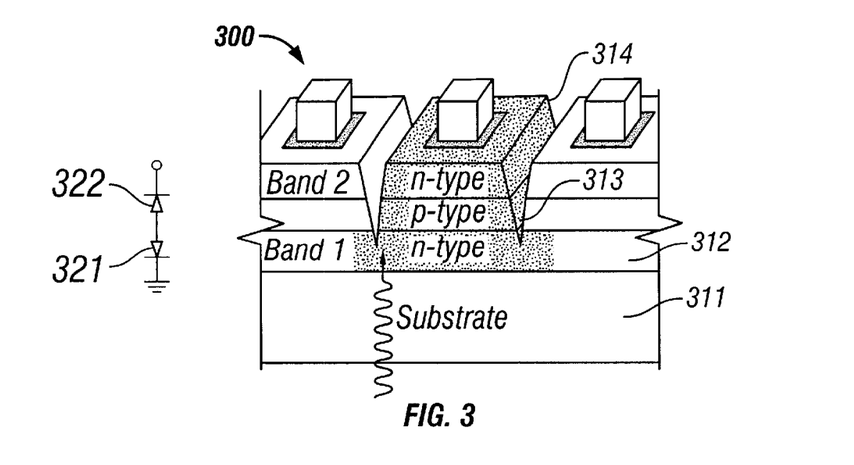
FIG. 3 is a perspective view of neighboring unit cells of a two-color photodetector array, in which each two-color photodetector is operated in sequential detection mode.

Referring now to FIG. 3, there is shown a perspective view of unit cells of a two-color photodetector array, in which each two-color photodetector 300 is operated in sequential detection mode. In sequential mode, the dual p-n junctions of detector 300 are electrically isolated (other than a common ground) from those of other unit cells in the same wafer by the same single-mesa delineation step. These form photodiodes electrically coupled together in series, illustrated schematically in FIG. 3 as diodes 322, 321. However, unlike in simultaneous mode, contact is made only to the top n-type layer 312 and to the bottom contact layer 311, which is used as an array common. Having no contact to the p-type barrier layer 313, each detector is sequentially accessed by the bias voltage applied across the tandem junctions. For example, a first bias voltage is applied across the two contacts, to activate the first photodiode 321 and effectively short photodiode 321; the opposite occurs in a second measuring operation using a second bias voltage. Sequential mode thus requires only a single metal contact (e.g., indium bump) per unit cell. Waveguiding of incident radiation may be employed to achieve 100% optical fill factor in both bands. For example, the angle of the mesa sides of each unit cell can be selected so that radiation does not pass through the gap between unit cells, but instead is reflected off he inside of a unit cell's mesa walls so that it is detected by the photodiodes of the unit cell. Further discussion of these types of detectors may be found in T. De Lyon, J. L. Johnson, et al., "Molecular Beam epitaxial growth of HgCdTe midwave infrared multispectral detectors," *J. Vac. Sc Technol.* B, 16(3) pp 1321–1325, 1998.

Other multispectral detector designs also use a plurality of n-type absorbing layers stacked on a common substrate but the deposition of the p-type contact layers is omitted. Instead, in this approach, the photovoltaic junctions are created by implanting a p-type dopant into delineated areas of the absorbing layers at a later stage of fabrication. Such multispectral detectors are described in U.S. Pat. No. 5,479, 032 (Forrest et al.), the entirety of which is incorporated by reference herein.

Unfortunately, there are fundamental material issues associated with the growth of such multispectral detectors employing a plurality of stacked absorbing layers. These structures consist of absorption layers traditionally formed from semiconductor alloys. In each of the layers, the composition of the alloy is chosen to provide an energy gap sensitive to the spectral band of interest. As the layers are stacked (grown), the composition is changed toward decreasing energy gap; further, each absorbing layer must be optically thick enough to absorb the radiation and provide spectral discrimination of the incident light. However, with the change of composition and energy gap comes a substantial change in lattice parameter relative to the substrate and/or the preceding layer. As a result, lattice mismatch dislocations can propagate up though successive absorption layers, diminishing the crystalline quality of the material and ultimately leading to reduced performance.

Typically, a lattice mismatch of $\Delta a/a_0 < 0.05\%$ is desirable (where $a_0$ is the lattice constant of the substrate or base layer on which an epi layer is grown, and $\Delta a$ is the difference in lattice constant between the epi layer and the substrate, or preceding layer, on which it is grown). Requirements for lattice matching can either restrict the alloy composition to a small subset of available possibilities, or the limit the growth thickness of the absorbing layer, which may prevent adequate absorption of the light in the respective spectral band. Forest et al., in the '032 patent, circumvented this problem by including buffer layers of increased lattice constant interlaced between the stacked absorbing layers. This approach complicates the growth; also, it does not completely prevent lattice mismatch dislocations from forming but merely getters or concentrates them in regions outside the active absorption layers. Other approaches rely on the very small lattice mismatch associated with closely lattice-matched ternary and quaternary compounds such as AlGaAs, HgCdTe, or InGaAsP. This approach restricts the choices of available alloy. Hence, the diversity of spectral bands that can be combined in a given detector stack is limited to but a few selections afforded by nature.

There is, therefore, a need for improved multispectral photodetectors.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

In order to further the development of multispectral photodetectors, there is a need for a new approach to the stacking of multiple absorption layers with varying energy gap, without giving rise to lattice mismatch. An embodiment of the present invention employs absorption layers formed from strain-compensating (or -compensated) superlattices, which can be designed with varying energy gap (responsive to a particular spectral region) but nearly perfectly lattice-matched to the underlying substrate and to each other.

The absorption and contact regions of photodetectors, such as that illustrated in FIGS. 1–3, are formed using semiconductor materials. Semiconductor alloys have been used traditionally. In recent years, semiconductor superlattices formed from thin alternating layers of two different semiconductors have been used in photodetector structures. Further discussion of superlattice photodiodes may be found, for example, in: Jeffery L. Johnson et al. "Electrical and optical properties of infrared photodiodes using the InAs/Ga$_{1-x}$In$_x$Sb superlattice in heterojunctions with GaSb," *J. Appl. Phys.* 80(2), pp. 1116–1127, 1996; Bürkle et al., "Electrical characterization of InAs/(GaIn)Sb infrared superlattice photodiodes for the 8 to 12 µm range," *Mat. Res. Soc. Symp. Proc.* Vol. 607, p. 77, 2000; and Fuchs et al., "InAs/Ga$_{1-x}$In$_x$Sb infrared superlattice photodiodes for infrared detection," *Proc. SPIE* 3287, p. 14, 1998.

The constituent layers of a superlattice as described in these references are thin enough that the energy band structures of the layers interact with each other to form conduction and valence "minibands" extending throughout the superlattice. The lowest-energy conduction miniband may be described as the "effective conduction band," the highest-energy valence miniband may be described as the "effective valence band," and the energy difference between these bands may be described as the "effective energy gap" or "effective bandgap" of the superlattice. Energy band diagrams as used herein are intended to represent the effective band structure in the case of superlattice implementations. Furthermore, the phrase "energy gap" or "bandgap" is intended to also refer to an effective energy gap in the case of superlattices.

There exists a class of superlattice structures referred to as "strained-compensating" superlattices, sometimes referred to as "strained-layer" superlattices (SLS). These structures are formed by layers of materials having lattice constants that are alternately smaller and larger than that of the substrate upon which they are grown. The layers with smaller lattice constant are said to be in tension while the layers with larger lattice constant remain in compression. However, the net cumulative strain in the layer stack can be balanced so that the structure becomes pseudomorphically latticed-matched to the substrate. The physics of these types of structures is discussed in further detail in *Semiconductors and Semimetals*, vol. 32: *Strained Layer Superlattices: Physics*, R. K. Willardson & Albert C. Beer, eds. (New York: Academic Press, 1990), esp. ch. 1.

One unique feature of strain-compensated superlattice structures is that due to the many degrees of freedom in the design parameter space, it is possible to produce absorbing materials with an energy gap sensitive to a wide range of spectral bands while maintaining lattice-matched conditions to an underlying substrate, such as GaSb, or to a preceding and other adjacent layers of a fabricated semiconductor structure.

One type of strain-compensated superlattice is the mixed-anion superlattice. One such type of mixed-anion superlattice employs alternating layers formed from binary, ternary, or quaternary variations of In$_x$Ga$_y$Al$_{1-x-y}$As and In$_x$Ga$_{1-x-y}$Al$_y$Sb grown on GaSb substrates. The subscripts of the first three elements of each compound may be rearranged, but they should add to 1. Moreover, the parameters x, y are independent for each of the two alternating layer structures. In one embodiment, for example, x=1 and y=0 for the first alternating layer; and x=x and y=0 for the second superlattice layer, resulting in an InAs/In$_x$Ga$_{1-x}$Sb superlattice system. The InAs/In$_x$Ga$_{1-x}$Sb superlattice system represents one such structure suitable for IR detector applications.

Fuchs et al. demonstrated lattice matched InAs/In$_x$Ga$_{1-x}$Sb structures by precisely engineering the interfacial layers between the constituent materials. See F. Fuchs et al, "Optoelectronic properties of photodiodes for the mid- and far-infrared based on the InAs/GaSb/AlSb materials family," presented at Photonics West 2001 SPIE Conference, San Jose, Calif. (January 2001; forthcoming). These interfacial layers can be InSb-like or GaAs-like in nature, each contributing differently to the overall strain. The net result is that different superlattices with varying spectral properties can be grown nearly lattice matched to GaSb.

Figure 4:
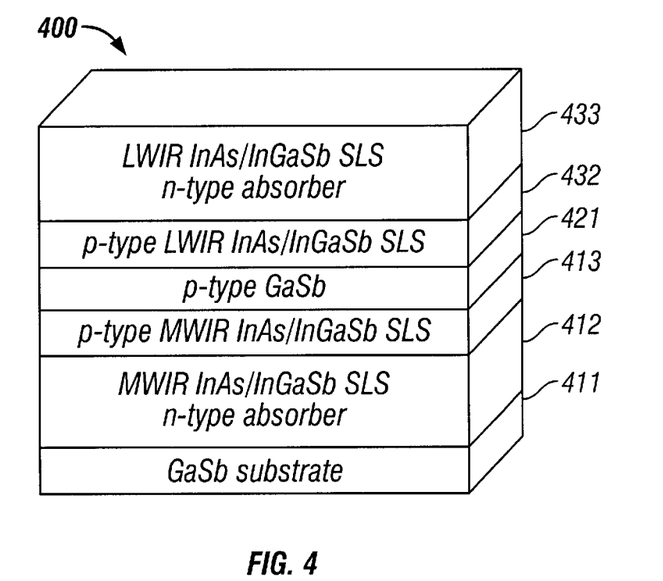
FIG. 4 is a perspective view of a multispectral photodetector employing strain-compensating superlattices, in accordance with an embodiment of the present invention.

Hence, absorbing materials formed from these superlattices can be grown together to form a plurality of layers constituting a multispectral detector layer stack. Referring now to FIG. 4, there is shown a perspective view of a multispectral photodetector 400 employing two strain-compensating superlattice absorption layers, responsive to different spectral regions, in accordance with an embodiment of the present invention. Each strain-compensating superlattice absorption layer can be designed with a particular bandgap responsive to radiation energy in corresponding spectral regions, and can also be designed to be nearly perfectly lattice-matched to both the underlying substrate and to other layers of the fabricated photodetector.

For example, InAs/In$_x$Ga$_{1-x}$Sb superlattice structures may be used to form photodiode absorption layers with a bandgap responsive to mid-wavelength IR (MWIR) radiation; to short-wavelength IR (SWIR); or to long-wavelength IR (LWIR). With a multispectral detector, such as a two-color detector having both MWIR and LWIR spectral regions, better results may be obtained than with single-color detectors. For example, the MWIR region (e.g., the mid-IR atmospheric window from 3 $\mu$m to 5 $\mu$m) may be better suited for normal night-vision sensing; and LWIR sensing (e.g., the long-IR atmospheric window from 8 $\mu$m to 12 $\mu$m), while not necessarily as detailed for night vision as is MWIR, may be better suited for long-range sensing, sensing through fog and smoke, and so forth. Suitable signal processing can be using to combine the signals to obtain improved image or data acquisition.

In an embodiment, as shown in FIG. 4, the multispectral radiation detector 400 is a two-color MWIR/LWIR SLS detector formed from an n-p-n layer stack of InAs/In$_x$Ga$_{1-x}$Sb superlattices and GaSb. The n-p-n layer stack of photodetector 400 consists of a MWIR InAs/In$_x$Ga$_{1-x}$Sb superlattice (SLS) n-type absorbing layer 412, a p-type (transparent) GaSb barrier layer, and a LWIR InAs/In$_x$Ga$_{1-x}$Sb superlattice n-type absorbing layer 433, as well as p-type layers 413, 432, all grown nearly lattice matched to the (transparent) GaSb substrate 411. The subscripts x and y are selected for layer 433 to achieve an appropriate cutoff wavelength for LWIR absorption; and likewise for layer 412, for MWIR.

Multispectral radiation detector 400 is thus for detecting radiation in at least two spectral bands, and has substrate 411, and a layer stack grown on the substrate. The layer stack comprises at least first and second photodiodes (i.e., the first photodiode comprising layers 412, 413; the second comprising layers 432, 433), each photodiode having at least one strain-compensating superlattice absorbing layer (i.e., layers 412, 433) substantially lattice matched to adjacent layers of the detector. Each strain-compensating superlattice absorbing layer has an energy gap responsive to radiation energy in a corresponding spectral region and different from the energy gaps of other strain-compensating superlattice absorbing layers of the detector.

Each superlattice absorbing layer of a photodiode has a given type of electrical conductivity (i.e., either p-type or n-type), and forms a junction with a second layer having the other type of electrical conductivity (i.e., either n-type or p-type), so as to from a p-n photojunction. This photojunction collects the current resulting from absorption of photons by the absorbing layer(s) of the photodiode, from radiation in the spectral band corresponding to the energy gap of the absorbing layer(s). The second layer of each photodiode can be, but need not be, of the same type of superlattice structure as the absorbing superlattice layer of the photodiode. In the case where the second layer is of the same strain-compensating superlattice structure as its corresponding absorbing layer, the second layer also serves as an absorbing layer for the photodiode, although typically its contribution to the current collected across the photojunction is inconsequential or insubstantial. The photojunctions of the photodiodes are coupled in series and function electrically as two back-to-back (tandem) diodes.

The layers of detector 400, including the alternating layers of each SLS layer, may be grown with suitable techniques, such as molecular beam epitaxy (MBE), or other techniques such as liquid phase epitaxy (LPE) or metalorganic chemical vapor deposition (MOCVD).

In photodetector 400, light passes through substrate 411 first, moving upwards. In such an embodiment, the GaSb substrate 411 must be transparent at least to the spectral bands of absorber layers 412, 433; and p-type GaSb barrier layer 421 must be transparent at least to the spectral band of LWIR absorber layer 433. Also, the shorter-cutoff-wavelength absorption layer (i.e., MWIR absorber layer 412) must receive the light incident on photodetector 400 before longer-cutoff-wavelength absorption layers (e.g., LWIR absorber layer 433). Otherwise, the LWIR absorber layer 433 would absorb most of the light before it reached MWIR absorber layer 412. For example, n-type MWIR absorber layer 412 is designed to be lattice-matched to the GaSb substrate 411, and to have an energy gap providing sensitivity (i.e., absorption) of radiation with wavelengths below 5.5 $\mu$m; and n-type LWIR absorber layer 433 is designed to be lattice-matched to the GaSb substrate 411 (and to other layers 432, 421, 413, 412 of photodetector 400), and to have an energy gap providing sensitivity (i.e., absorption) of radiation with wavelengths below about 10.5 $\mu$m.

To achieve these cutoff wavelengths and lattice matching, in one embodiment, the detector structure begins with an MWIR p-n junction (the junction of layers 412, 413) formed from an appropriately doped 27 Å InAs/18 Å GaSb superlattice, which is sensitive to IR radiation with wavelengths below 5.5 $\mu$m at 77 K; i.e., the MWIR photodiode is sensitive to the spectral "band" from 0 to 5.5 $\mu$m. This photodiode is formed by growing MWIR n-type absorber layer 412 on GaSb substrate 411, and then growing p-type MWIR layer 413 on layer 412, as will be appreciated.

A p-type GaSb layer is used as an isotype heterojunction barrier separating the bottom p-n homojunction from the LWIR p-n homojunction grown on top. The LWIR p-n junction photodiode (i.e., layers 432, 433) consists nominally of a 42 Å InAs/20 Å In$_{0.20}$Ga$_{0.80}$Sb superlattice, which is sensitive to radiation with wavelengths below 10.5 $\mu$m. Because wavelengths up to 5.5 $\mu$m are substantially absorbed by layer 412 (and to a small degree, layer 413), layer 433 has an effective spectral absorption region of approximately 5.5 $\mu$m to 10.5 $\mu$m. Thus, MWIR absorber layer 412 is sensitive to the mid-IR atmospheric window from 3 $\mu$m to 5 $\mu$m; and LWIR absorber layer 433 is sensitive to (part of) the long-IR atmospheric window from 8 $\mu$m to 12 $\mu$m.

In an embodiment, the substrate has an arbitrary thickness, and the other layers of detector 400 have the following approximate thicknesses: layer 411, 5 to 10 $\mu$m; layer 412, about 1 $\mu$m; layer 421, about 3 $\mu$m; layer 432, about 1 $\mu$m (p-type layers 432, 421, 413 should be about 5 $\mu$m total); layer 413, 5 to 10 $\mu$m. The n-type layers may be thinner, given a higher absorption coefficient, as will be appreciated.

In the embodiment of FIG. 4, layer 413 has the same InAs/In$_x$Ga$_{1-x}$Sb superlattice structure as layer 412; only the doping and layer thickness is different. Also, layer 433 has the same InAs/In$_x$Ga$_{1-x}$Sb superlattice structure as layer 432; again, only the doping and layer thickness is different. This means that the p-type layers 432, 413 have the same spectral absorption region as their corresponding n-type absorber layers 433, 412, respectively. However, the n-type layers 412, 433 are referred to as "absorber" layers, for several reasons. First, these layers are thicker than the thinner p-type layers 432, 413, and thus absorb more of the radiation in that spectral band. Second, in this embodiment, the n-type absorber layers are better collectors, and thus convert more of the absorbed light into usable electrical signal across the p-n junction of the corresponding photodiode. Third, for the MWIR photodiode, thicker n-type layer 412 absorbs most of the light in the MWIR spectral band before it reaches p-type layer 413.

Figure 5:
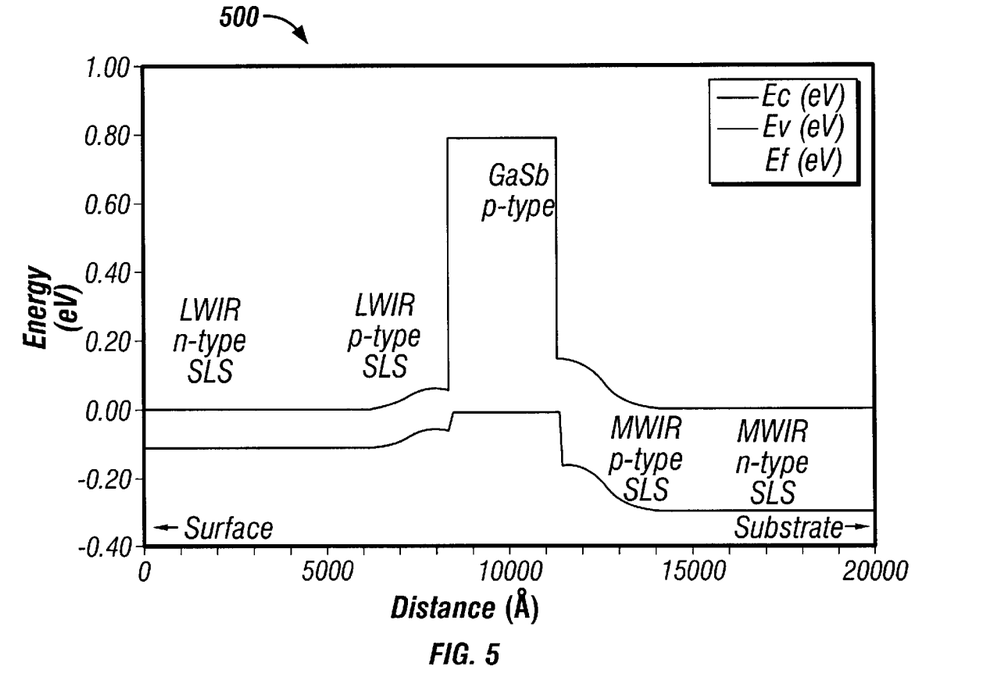
FIG. 5 shows the energy band diagram of the tandem photodiodes of the photodetector of FIG. 4.

Radiation detector 400 thus has a two-color (two-spectral region) structure consisting of two back-to-back p-n junctions separated by a p-type GaSb barrier layer. In other words, layers 412, 413 form an MWIR photodiode, and layers 432, 433 form an LWIR photodiode, as will be appreciated. These photodiodes are electrically coupled at their anode terminals via p-type barrier layer 421, and may be referred to as tandem photodiodes. Referring now to FIG. 5, there is shown the energy band diagram 500 of the tandem photodiodes of photodetector 400 of FIG. 4. In FIG. 5, energy bands of the superlattices are represented by the bottommost/topmost energy levels of the conduction/valence minibands. In particular, the conduction band ($E_C$) and valence band ($E_V$) energy band edges represent the bottommost/topmost energy levels of the conduction/valence superlattice sub-bands. The horizontal line at 0 eV, denoted $E_F$, represents the Fermi energy level. The vertical difference between $E_C$ and $E_V$ represents the effective band-gap.

Referring once more to FIG. 4, each of the superlattice layers of the two photodiodes are engineered to be sensitive to separate spectral bands but nearly lattice matched to GaSb. By alleviating growth complications due to lattice mismatch, it is possible to grow arbitrarily thick, high-quality absorber layers. Optically thick layers are required to effectively absorb the incident radiation as signal in the respective spectral band. It also preserves the spectral purity of the multi-color signal by preventing radiation from one spectral band (e.g., band 1, the MWIR band sensed by absorber layer 412) propagating into the other absorber region, appearing as signal in the other spectral region. Hence, the lattice matching conditions met by strain-compensated superlattices permits material more suitable for multispectral detectors formed from a plurality of such layers.

Photodetector 400 may be one of a plurality (e.g., a two-dimensional array) of similar photodetectors fabricated simultaneously and identically on the same substrate (wafer).

Each radiation detector, such as detector 400, must have sufficient contacts to permit the photodiodes of the detector to be biased and the current therein measured. Detector 400 can operate in either sequential or simultaneous mode. In simultaneous mode, as described above, an array common contact is made to the substrate 411 and n-type absorber layer 412; and electrical contacts are also made to (top) n-type absorber layer 433 and to p-type barrier layer 421. This latter contact may be made by appropriate etching and deposition techniques, as will be understood. In this case, the On junction of each photodiode of the detector is independently biased and its diode current (related to the radiation absorbed) is sensed. The two top metal contacts used for simultaneous operation may be indium bumps, for example. In sequential mode, the contact to barrier layer 421 need not be made. Whether sequential or simultaneous mode is employed, the signals for bands 1 and 2 may be subjected to further signal processing to optimize the image or information gathered. In an embodiment, when a photodiode of detector 400 is biased by an appropriate voltage, the photodiode current (current across the diode's p-n junction) will be related in a known manner (i.e., roughly proportional) to the intensity of light passing through the photodiode that is within the spectral band of the n-type absorber region of the photodiode. Thus, by measuring the diode current, the light intensity within a given spectral band may be determined.

Multispectral photodetectors in accordance with the present invention may be employed in a variety of applications. For example, an array of such photodetectors may be used in a camera, for night-vision purposes. In another application, a two-color photodetector array may be employed in an industrial camera to directly monitor and map the surface temperature of a wafer undergoing growth by MBE. Such information could be used to monitor the MBE process for improved quality control, as will be appreciated by those skilled in the art.

In alternative embodiments, a multispectral photodetector, in accordance with the present invention, has more than two strain-compensating superlattice photodiodes, to provide a plurality of detection spectra. For example, three separate photodiodes, for SWIR, MWIR, and LWIR, respectively, may be employed.

In an alternative embodiment, layer 413 may have a different superlattice structure from layer 412; and layer 432 may have a different superlattice structure from that of layer 433. In S such an embodiment, all SLS layers preferably have a lattice structure selected to be nearly perfectly lattice-matched to both the underlying substrate and to each other; and the two (or more) absorber SLS structures are different from one another, so as to have a different effective energy gap and thus respond to a different spectral band.

In further alternative embodiments, the spectral regions detected by detector 400 may be spectral regions outside the IR spectrum. In this case, each SLS layer has the appropriate structure designed to absorb in the spectral region of interest, while maintaining the appropriate lattice constant. In embodiments described above, SLS structures based on mixed-anion superlattices were employed. As noted above, such superlattices may employ alternating layers formed from binary, ternary, or quaternary variations of In$_x$Ga$_y$Al$_{1-x-y}$As and In$_x$Ga$_{1-x-y}$Al$_y$Sb grown on GaSb substrates. In particular, the InAs/In$_x$Ga$_{1-x}$Sb superlattice system was used for IR spectral sensitivity: 27 Å InAs/18 Å GaSb for MWIR, 42 Å InAs/20 Å In$_{0.20}$Ga$_{0.80}$Sb for LWIR. In alternative embodiments, other types of SLSs (strain-compensating superlattices) may be employed for the p and n layers of the photodiodes of the detector. For example, variations of the InAs/In$_x$Ga$_{1-x}$Sb superlattice system other than those given above for the MWIR and LWIR spectral regions, may be employed; other variations of the binary, ternary, or quaternary variations of In$_x$Ga$_y$Al$_{1-x-y}$As and In$_x$Ga$_{1-x-y}$Al$_y$Sb grown on GaSb substrates may be employed; and mixed-anion superlattice systems other than binary, ternary, or quaternary variations of In$_x$Ga$_y$Al$_{1-x-y}$As and In$_x$Ga$_{1-x-y}$Al$_y$Sb may be employed. In addition, strain-compensating superlattice structures other than mixed-anion superlattice systems may be employed.

In the embodiment of FIG. 4, an n-p-n structure is used, in which p-type GaSb layer 421 acts as a barrier layer, between p-type photodiode layers 432 and 413. I.e., p-type GaSb layer 421 is an isotype heterojunction barrier separating two p-n homojunctions. In an alternative embodiment, p-type photodiode layers 432 and 413 are omitted; layers 433 and 412 directly join to p-type layer 421. In this case, the junction of the n-type layers 433 and 412 with p-type layer 421 form a double heterojunction.

In the embodiment of FIG. 4, an n-p-n structure is used. In alternative embodiments, a p-n-p structure is employed, with the thicker absorbing layers being the p-type layers of the respective photodiodes, instead of the n-type layers as shown in FIG. 4.

In the embodiment of detector 400, shorter-cutoff-wavelength absorption layers are placed physically below longer-cutoff-wavelength absorption layers, when light is directed into the photodetector structure from the bottom up, through the transparent substrate. This ensures that each SLS absorption layer receives and filters (absorbs or passes) radiation before the passed radiation reaches any longer-cutoff-wavelength SLS absorption layers. In an alternative embodiment, light (radiation) to be detected impinges on the photodetector from the top instead of from the bottom. In this case, the shorter-cutoff-wavelength photodiodes are above all longer-cutoff-wavelength photodiodes, opposite the arrangement in detector 400; and the substrate need not be transparent.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims, giving full cognizance to equivalents in all respects.

What is claimed is:

1. A radiation detector for detecting radiation directed into the radiation detector, the radiation detector comprising:

a substrate: and a layer stack grown on the substrate, the layer stack comprising first and second photodiodes having respective first and second strain-compensating superlattice absorbing layers, each of the strain-compensating superlattice absorbing layers being substantially lattice matched to adjacent layers of the radiation detector and having an energy gap responsive to radiation energy in a corresponding spectral region and different from the energy gap of other strain-compensating superlattice absorbing layer of the radiation detector, the layer stack further comprising a transparent barrier layer between said fist and second strain-compensating superlattice absorbing layers, wherein the first and second strain-compensating superlattice absorbing layers are either n-type or p-type and the transparent barrier layer has a conductivity type opposite to that of the strain-compensating superlattice absorbing layers, whereby the first strain-compensating superlattice absorbing layer, the transparent barrier layer, and the second strain-compensating superlattice absorbing layer form either an n-p-n or p-n-p structure.

2. The radiation detector of claim 1, wherein said first and second strain-compensating superlattice absorbing layers are mixed-anion stain-compensating superlattice absorbing layers.

3. The radiation detector of claim 1, wherein the first and second strain-compensating superlattice absorbing layers are n-type strain-compensating superlattice absorbing layers and the transparent barrier layer is p-type transparent barrier layer, whereby the first n-type strain-compensating superlattice absorbing layer, the p-type transparent barrier layer, and the second n-type stain-compensating superlattice absorbing layer form an n-p-n structure in the layer stack.

4. The radiation detector of claim 3, wherein the substrate is a GaSb substrate and said first and second strain-compensating superlattice absorbing layers are mixed-anion strain-compensating superlattice absorbing layers employing alternating layers formed from binary, ternary, or quaternary variations of $In_xGa_yAl_{1-x-y}As$ and $In_xGa_{1-x-y}Al_ySb$.

5. The radiation detector of claim 4, wherein said first and second strain-compensating superlattice absorbing layers comprise alternating $InAs/In_xGa_{1-x}Sb$ layers.

6. The radiation detector of claim 5, wherein:

the spectral regions of the first and second strain-compensating superlattice absorbing layers are MWIR and LWIR, respectively, and the it strain-compensating superlattice absorbing layer comprises an alternating 27 Å InAs/18 Å GaSb strained-compensating superlattice layer structure; and the second stain-compensating superlattice absorbing layer comprises an alternating 42 Å InAs/20 Å $In_{0.20}Ga_{0.80}Sb$ strained-compensating superlattice layer structure.

7. The radiation detector of claim 3, wherein the layer stack further comprises, for each photodiode, a p-type layer between the p-type transparent barrier layer and the corresponding strain-compensating superlattice absorbing layer of the photodiode, wherein each photodiode has a p-n homojunction and the p-type transparent barrier layer provides an isotype heterojunction barrier separating the p-n homojunctions of the first and second photodiodes.

8. The radiation detector of claim 3, wherein the transparent barrier layer is directly adjacent to the first and second strain-compensating superlattice absorbing layers, wherein the transparent barrier layer provides a double heterojunction comprising a p-n heterojunction for each photodiode.

9. The radiation detector of claim 1, wherein the first and second strain-compensating superlattice absorbing layers are p-type strain-compensating superlattice absorbing layers and the transparent barrier layer is n-type transparent barrier layer, whereby the first p-type strain-compensating superlattice absorbing layer, the n-type transparent barrier layer, and tie second p-type strain-compensating superlattice absorbing layer form a p-n-p structure in the layer stack.

10. The radiation detector of claim 1, wherein the substrate is transparent to the spectral regions of the first and second photodiodes.

11. The radiation detector of claim 10, wherein the photodiodes are arranged in the layer stack so that the radiation is received first by photodiode having strain-compensating superlattice absorbing layers with shorter cutoff wavelengths.

12. The radiation detector of claim 1, further comprising a common signal contact electrically coupled to the substrate and a top contact electrically coupled to the second strain-compensating superlattice absorbing layer, for sequential operation of the photodetectors.

13. The radiation detector of claim 1, further comprising a common signal contact electrically coupled to the substrate, a first contact electrically coupled to the second strain-compensating superlattice absorbing layer, and a second contact electrically coupled to the transparent barrier layer, for simultaneous operation of the photodetectors.

14. The radiation detector of claim 1, wherein the spectral regions of the first and second strain-compensating superlattice absorbing layers are mid-wavelength infrared (MWIR) and long-wavelength infrared (LWIR), respectively.

15. The radiation detector of claim 1, wherein each photodiode has a second layer adjacent to the respective strain-compensating superlattice absorbing layer of the photodiode, the second layer for each photodiode having an electrical conductivity type opposite to that of the strain-compensating superlattice absorbing layer of said each photodiode and having the same strain-compensated superlattice structure as that of the absorbing layer of said each photodiode.

16. The radiation detector of claim 1, wherein each layer of the layer stack is substantially lattice matched to adjacent layers of the detector so that the lattice mismatch between any adjacent layers is no greater than 0.05%.

* * * * *

UNITED STATES PATENT AND TRADEMARK OFFICE
CERTIFICATE OF CORRECTION

PATENT NO.    : 6,455,908 B1
DATED         : September 24, 2002
INVENTOR(S)   : Johnson et al.

It is certified that error appears in the above-identified patent and that said Letters Patent is hereby corrected as shown below:

Column 11,
Line 58, replace "fist" with -- first --

Signed and Sealed this

Eighteenth Day of March, 2003

JAMES E. ROGAN
*Director of the United States Patent and Trademark Office*